(12) United States Patent
Sebastiano et al.

(10) Patent No.: US 9,817,082 B2
(45) Date of Patent: Nov. 14, 2017

(54) MAGNETIC SENSOR ARRANGEMENT

(71) Applicant: NXP B.V., Eindhoven (NL)

(72) Inventors: Fabio Sebastiano, Eindhoven (NL); Robert Hendrikus Margaretha Van Veldhoven, Dommelen (NL)

(73) Assignee: NXP B.V., Eindhoven (NL)

( * ) Notice: Subject to any disclaimer, the term of this patent is extended or adjusted under 35 U.S.C. 154(b) by 976 days.

(21) Appl. No.: 13/899,915

(22) Filed: May 22, 2013

(65) Prior Publication Data
US 2013/0328550 A1 Dec. 12, 2013

(30) Foreign Application Priority Data

Jun. 6, 2012 (EP) .................................. 12170927

(51) Int. Cl.
*G01R 33/06* (2006.01)
*G01D 5/14* (2006.01)
(Continued)

(52) U.S. Cl.
CPC ............. *G01R 33/06* (2013.01); *G01B 7/023* (2013.01); *G01D 5/145* (2013.01); *G01R 33/0029* (2013.01)

(58) Field of Classification Search
CPC ...... G01P 3/22; G01P 3/42; G01P 3/44; G01P 3/48
See application file for complete search history.

(56) References Cited

U.S. PATENT DOCUMENTS 4,370,614 A * 1/1983 Kawada ................ G01P 13/045
324/165
4,791,366 A * 12/1988 Suzuki .................... G01P 3/487
324/207.25
(Continued)

FOREIGN PATENT DOCUMENTS

| CN | 101802633 A | 8/2010 |
| CN | 101855563 A | 10/2010 |
| CN | 102346045 A | 2/2012 |

OTHER PUBLICATIONS

Extended European Search Report for EP Patent Appln. No. 12170927.3 (dated May 2, 2013).

*Primary Examiner* — Kristal Feggins
*Assistant Examiner* — Kendrick Liu
(74) *Attorney, Agent, or Firm* — Rajeev Madnawat

(57) ABSTRACT

A magnetic sensor arrangement for determining information indicative of characteristics of a mechanical component has a first magnetic sensor to sense a signal associated with a periodic changing magnetic field generated by relative movement of the mechanical component and the magnetic sensor arrangement, a second magnetic sensor to sense that signal, wherein the first sensor is arranged a fixed distance from the second sensor, and a determination unit coupled to the first and second sensors to receive output signals of the first and second sensors. The output signal of the first sensor is phase-shifted to the output signal of the second sensor, to compare the output signals for determining the absolute phase of the signal associated with the periodic changing magnetic field, and to determine information indicative of characteristics of the mechanical component based on the determined absolute phase of the signal associated with the periodic changing magnetic field.

18 Claims, 5 Drawing Sheets

(51) Int. Cl.
*G01R 33/00* (2006.01)
*G01B 7/02* (2006.01)

(56) References Cited

U.S. PATENT DOCUMENTS

| | | |
|---|---|---|
| 6,363,795 B1 | 4/2002 | Bergqvist et al. |
| 8,362,765 B2 | 1/2013 | Butzmann et al. |
| 8,659,288 B2 | 2/2014 | Harada |
| 2007/0188165 A1 | 8/2007 | Kitanaka et al. |
| 2008/0116886 A1 | 5/2008 | Yamada et al. |
| 2009/0146647 A1* | 6/2009 | Ausserlechner ....... G01D 5/145 324/207.21 |
| 2009/0243606 A1 | 10/2009 | Riedmuller |
| 2010/0194387 A1 | 8/2010 | Butzmann et al. |
| 2010/0321006 A1* | 12/2010 | Suzuki ................... G01D 5/145 324/207.25 |
| 2011/0309824 A1* | 12/2011 | Takahashi ............. F16C 41/007 324/207.13 |
| 2012/0025811 A1* | 2/2012 | Harada .................... G01B 7/30 324/207.21 |
| 2013/0049748 A1 | 2/2013 | Sebastiano et al. |
| 2014/0354270 A1* | 12/2014 | Kawano ................ G01B 7/003 324/207.21 |

\* cited by examiner

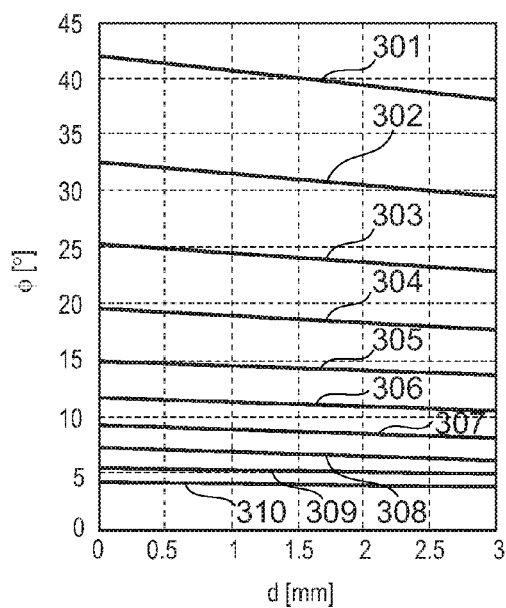
Fig. 3
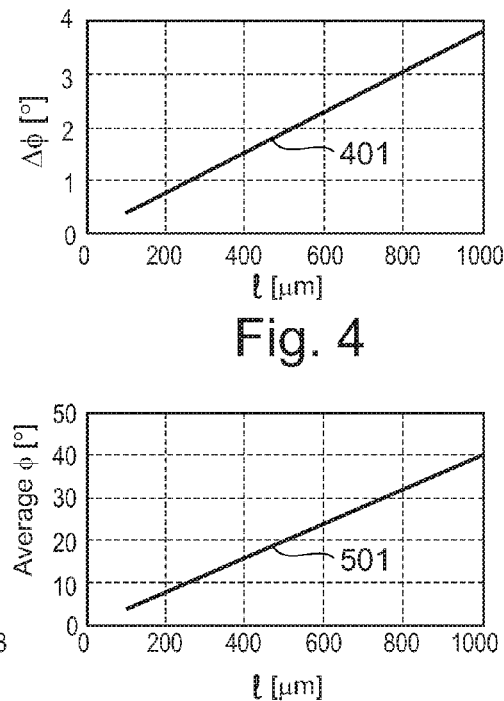
Fig. 4
Fig. 5
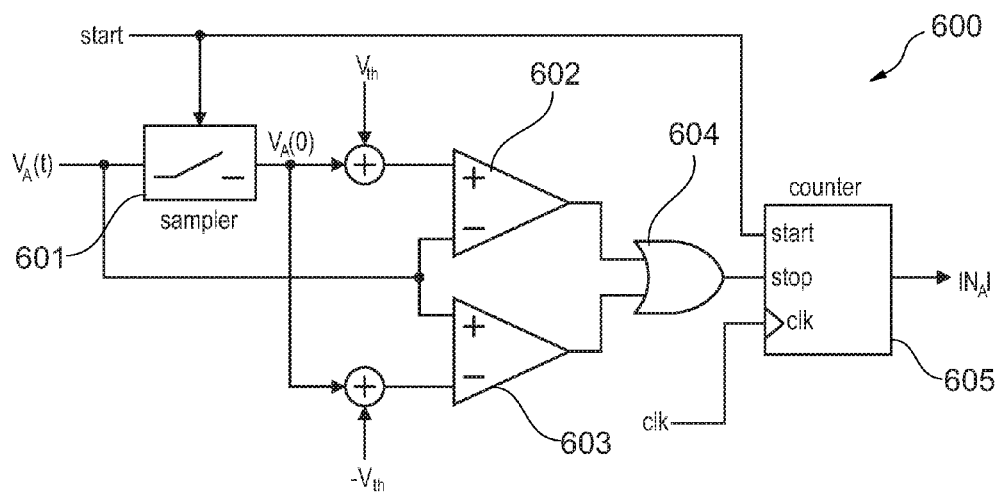
Fig. 6

MAGNETIC SENSOR ARRANGEMENT

CROSS-REFERENCE TO RELATED APPLICATIONS

This application claims the priority under 35 U.S.C. §119 of European patent application no. 12170927.3, filed on Jun. 6, 2012, the contents of which are incorporated by reference herein.

FIELD OF THE INVENTION

The invention relates to a magnetic sensor arrangement.

Further, the invention relates to sensor system comprising the magnetic sensor arrangement.

Beyond this, the invention relates to a method of determining information being indicative for characteristics of a mechanical component.

Moreover, the invention relates to a computer-readable medium.

Furthermore, the invention relates to a program element.

BACKGROUND OF THE INVENTION

Magnetic sensors in combination with permanent magnets or magnetized components can be used to sense the position and speed of mechanical components. For example, if a magnetic sensor is placed at close distance from a magnetized wheel, whose circumference is divided into sections alternatively magnetized as magnetic south and north, the magnetic sensor will sense a periodic changing magnetic field as the wheel rotates. By analyzing the output of the sensor and knowing the mechanical construction of the wheel, it is possible to determine, for example, the frequency of the time varying magnetic field at the sensor location and, consequently, the angular speed of the wheel.

In some applications, only specific positions of the mechanical part need to be detected. This translates in the detection of the instants at which the output of the magnetic sensor has particular values. For example, in many practical cases, it is interesting to identify the instants of the zero-crossing of the magnetic field.

Any error in the sensor or in its readout, such as any offset superimposed to the signal, will cause an error in the determination of the zero crossings. In many magnetic sensors, such as Anisotropic Magnetic Resistance (AMR) sensors, offset can be even larger than the signal amplitude, resulting in unacceptable errors or even in no detection. Moreover, if any offset is present in the magnetic domain, such as any DC stray field parallel to the field to be sensed, many conventional techniques for offset cancellation do not work properly.

Offset could be extrapolated by observing the sensor output signal for a limited amount of time and fitting it with the expected signal. However, this is unpractical if the signal is observed for less than one period and requires the knowledge of some characteristics of the signal (the shape, the amplitude, the frequency) which are not always available during normal working. On the contrary, the offset can be obtained by averaging one period of the sensor output signal and without any prior knowledge about the signal properties. However, in some applications it is not allowed to wait for a full period of the output signal before generating the first accurate zero-crossing signal. In those cases, sub-Hz magnetic fields are observed and waiting for a full period of the signal would result in a too large latency.

Currently, a common solution to those problems is calibration of the offset during testing. This can be done by laser trimming of the sensor or by measuring the offset during testing and using feed-forward compensation during normal operation. As a drawback, those techniques increase the testing costs and may bring to inaccurate results due to offset variations because of temperature or ageing.

US 2010/0194387 A1 discloses a magnetoresistive sensor system, wherein the system comprises a magnetic field source, a magnetoresistive sensor having an easy axis, and a differentiation element. The magnetic field source is adapted to emit an auxiliary magnetic field generated from an oscillating input signal. The auxiliary magnetic field is orthogonal to the easy axis of the magnetoresistive sensor. The magnetoresistive sensor is adapted to sense a signal associated to a superposition of an external magnetic field and the auxiliary alternating magnetic field, wherein the differentiation element is adapted to differentiate the sensed signal.

OBJECT AND SUMMARY OF THE INVENTION

It is an object of the invention to provide a magnetic sensor arrangement and method for providing an efficient way of determining information being indicative for characteristics of a mechanical component by sensing a magnetic field generated by the mechanical component.

In order to achieve the object defined above, a magnetic sensor arrangement, a sensor system comprising the magnetic sensor arrangement, a determination method, a computer-readable medium and a program element according to the independent claims are provided.

According to an exemplary embodiment of the invention, a magnetic sensor arrangement for determining information being indicative of characteristics of a mechanical component is provided. The magnetic sensor arrangement comprises a first magnetic sensor being adapted to sense a signal being associated with a periodic changing magnetic field being generated due to a relative movement of the mechanical component in relation to the magnetic sensor arrangement, a second magnetic sensor being adapted to sense the signal being associated with the periodic changing magnetic field, wherein the first magnetic sensor is arranged at a fixed distance to the second magnetic sensor, and a determination unit being coupled to the first magnetic sensor and the second magnetic sensor. The determination unit is adapted to receive the output signal of the first magnetic sensor and the output signal of the second magnetic sensor, wherein the output signal of the first magnetic sensor is phase-shifted to the output signal of the second magnetic sensor, to compare the output signals for determining the absolute phase of the signal being associated with the periodic changing magnetic field, and to determine information being indicative of characteristics of the mechanical component based on the determined absolute phase of the signal being associated with the periodic changing magnetic field.

According to a further exemplary embodiment, a sensor system is provided. The sensor system comprises a magnet sensor arrangement having the above described features and a mechanical component.

According to a further exemplary embodiment, a method of determining information being indicative of characteristics of a mechanical component is provided. The method comprises sensing, by a first magnetic sensor, a signal being associated with a periodic changing magnetic field being generated due to a relative movement of the mechanical component in relation to the magnetic sensor arrangement, sensing, by a second magnetic sensor, the signal being associated with the periodic changing magnetic field, wherein the first magnetic sensor is arranged at a fixed distance to the second magnetic sensor, and receiving, by a determination unit being coupled to the first magnetic sensor and the second magnetic sensor the output signal of the first magnetic sensor and the output signal of the second magnetic sensor, wherein the output signal of the first magnetic sensor is phase-shifted to the output signal of the second magnetic sensor. The method further comprises comparing the output signals for determining the absolute phase of the signal being associated with the periodic changing magnetic field, and determining information being indicative of characteristics of the mechanical component based on the determined absolute phase of the signal being associated with the periodic changing magnetic field.

According to a further exemplary embodiment, a computer-readable medium is provided, in which a computer program of determining information being indicative of characteristics of a mechanical component is stored, which computer program, when being executed by a processor, is adapted to carry out or control a method having the above mentioned features.

According to still another exemplary embodiment, a program element (for instance a software routine, in source code or in executable code) of determining information being indicative of characteristics of a mechanical component is provided, which program element, when being executed by a processor, is adapted to carry out or control a method having the above mentioned features.

Determining information being indicative of characteristics of a mechanical component, which may be performed according to embodiments of the invention, can be realized by a computer program that is by software, or by using one or more special electronic optimization circuits, that is in hardware, or in hybrid form, that is by means of software components and hardware components.

This invention describes how to obtain information of a mechanical component, for instance by an accurate zero-crossing detection, without any latency or additional calibration, with only limited information about the signal. In particular, no information on the absolute amplitude of the sensor outputs and their offset is required.

The term "magnetic sensor" may denote any kind of sensor being able to determine or sense signals being associated with a magnetic field, in this case a periodic or alternating magnetic field having an alternating signal. In one embodiment, the magnetic sensors may be magnetoresistive sensors.

The term "absolute phase" may refer to the phase of the signal being associated with the periodic changing magnetic field.

The term "phase-shifted" may refer to the fact that the two sensors sense the same signal and thus have the same signal output but at different time points and thus the output signals are phase-shifted.

In the following, further exemplary embodiments of the magnetic sensor arrangement will be explained. However, these embodiments also apply to the sensor system, the determination method, to the program element and to the computer-readable medium.

The comparison of the output signals for determining the absolute phase of the signal being associated with the periodic changing magnetic field being generated by the mechanical component may be based on the ratio of a derivative of each of the outputs signals. The output signals may be differentiated with respect to time. The results may be used to determine a ratio which is indicative for the absolute phase of the signal being associated with the period magnetic field.

The periodic changing magnetic field may be a rotating magnetic field due to relative movement of the mechanical component. In this case, the magnetic sensor arrangement may be an angle sensor for sensing an angle between the rotating magnetic field and a fixed direction. The first magnetic sensor may be adapted to sense a signal of the rotating magnetic field along the fixed direction and the second magnetic sensor may be adapted to sense a signal of the rotating magnetic field orthogonal to the fixed direction. The information being indicative of characteristics of the mechanical component may correspond to the angle between the rotating magnetic field and the fixed direction.

The herein described system can be used in any sensor system in which at least two sensors are used to sense the same physical quantity and there is a phase shift between the physical quantities at the input of the sensors. By knowing the value of this phase shift, the algorithm may be used to cancel the effect of two sensors.

One application would be the application to angular sensors, such as magnetic angular sensors. Angular sensors are usually composed of two sensors which sense the cosine and sine of the angle to be sensed. For example, in magnetic angular sensors, it is needed to sense the angle $\alpha$ between a rotating magnetic field and a fixed direction. A first magnetic sensor may be placed to sense the component of the field along the fixed direction and a second magnetic sensor may be placed to sense the component orthogonal to the fixed direction. In such an arrangement, the first sensor input may be equal to H $\cos(\alpha)$ and the second sensor input may be H $\sin(\alpha)$, where H is the amplitude of the magnetic field. Thus, the two sensor inputs are phase shifted by $\phi=90°$, and the previously described system can be applied.

The determination unit may be further adapted to determine characteristics of the output signal of the first magnetic sensor and of the output signal of the second magnetic sensor based on the comparison of the output signals. Based on the comparison, not only the absolute phase may be determined but also several characteristics of the sensors and their output signals.

The characteristics of the output signals may comprise offset between the output signals, absolute phase of the output signals and zero-crossings of the output signals. The zero-crossings are indicative for the periodic changing magnetic field and thus for the mechanical component and may be used inter alia for determine proper function of the mechanical component.

The determined information being indicative of characteristics of the mechanical component may comprise spatial period of the generated magnetic field and position of the mechanical component. Based on the information, different information on the mechanical component may be determined. The spatial period is indicative for the wavelength of the signal being associated with the period magnetic field, i.e., the distance over which the wave's shape repeats. Moreover, if the sensor output waveform is known, the proposed concept can be used to derive not only the zero-crossing but also the position of the mechanical parts.

The mechanical component may be a rotating moving mechanical component or a linear moving mechanical component providing an alternating magnetic field. This may be for instance a wheel, like a gear wheel. In any case, the mechanical component may be made of magnetic material pertubing a bias magnetic field or may be magnetized. The mechanical component may be arranged in order to generate an auxiliary magnetic field superposing a bias (external) magnetic field. The changes of the external magnetic field may be sensed as the signal being associated with the periodic changing magnetic field of the mechanical component.

The magnetic sensor arrangement may further comprise a third magnetic sensor being adapted to sense a signal being associated with the periodic changing magnetic field being generated by the mechanical component, wherein the third magnetic sensor is arranged at a fixed distance to the first magnetic sensor and/or the second magnetic sensor, and wherein the determination unit is further coupled to the third magnetic sensor and is further adapted to receive the output signal of the third magnetic sensor, wherein the output signal of the third magnetic sensor is a phase-shifted version of the output signal of the first magnetic sensor and/or the second magnetic sensor, to compare the output signals for determining the absolute phase of the signal being associated with the periodic changing magnetic field being generated by the mechanical component, and to determine information being indicative of characteristics of the mechanical component based on the determined absolute phase of the signal being associated with the periodic changing magnetic field being generated by the mechanical component. The first two sensors can be used to obtain an offset-free reading of the magnetic signal and consequently an accurate reading of the mechanical position, by using the algorithm and the method described. Though providing a good compensation of the offset, the described method could fail in achieving some specification, such as noise performance. In such case, the first two sensors, which together give an offset-free reading, are used to compensate the offset of the third sensor, which could provide all the required specification, such as the required noise performance.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 3 illustrates a diagram showing a sensor phase shift versus a distance from a wheel for several lengths.

FIG. 4 illustrates a diagram showing a maximum phase variation versus a distance between sensors.

FIG. 5 illustrates a diagram showing an average phase variation versus distance between sensors.

FIG. 6 illustrates a block diagram illustrating an approximation of the sensor output derivative according to an embodiment of the invention.

DESCRIPTION OF EMBODIMENTS

Figure 1:
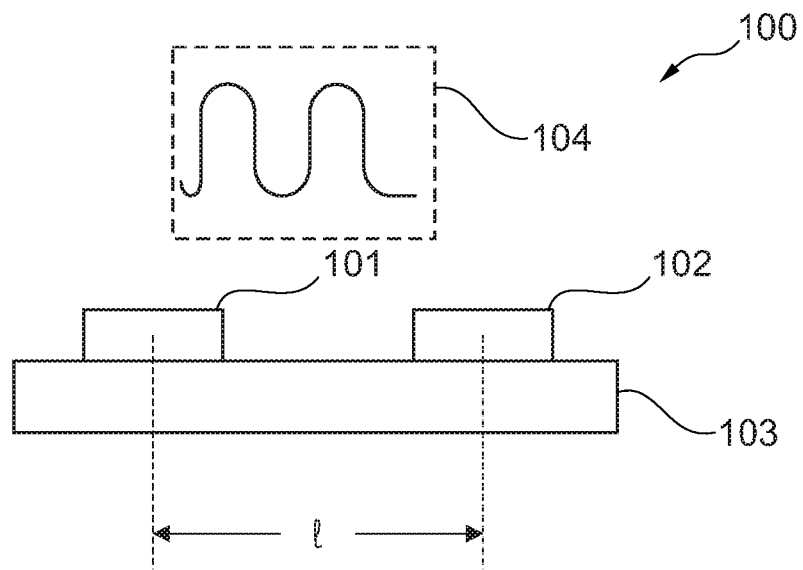
FIG. 1 illustrates a magnetic sensor arrangement according to an exemplary embodiment of the invention.

The illustration in the drawing is schematically. In different drawings, similar or identical elements are provided with the same reference signs.

As shown in FIG. 1, the described magnetic sensor arrangement 100 consists of two magnetic sensors 101, 102 (in this example arranged on a substrate 103 which can comprise the determination unit) spaced by a fixed distance 1 and placed in close proximity to the mechanical part or component 104 generating the sensing magnetic field.

The magnetic sensor arrangement 100 is adapted to determine information being indicative of characteristics of the mechanical component 104. The first magnetic sensor 101 is adapted to sense a signal being associated with a periodic changing magnetic field being generated due to a movement of the mechanical component in relation to the magnetic sensor arrangement, and the second magnetic sensor 102 is adapted to sense the signal being associated with the periodic changing magnetic field being generated due to the movement of the mechanical component. The determination unit 103 is coupled to the first magnetic sensor 101 and the second magnetic sensor 102 and is adapted to receive the output signal of the first magnetic sensor 101 and the output signal of the second magnetic sensor 102, wherein the output signal of the first magnetic sensor 101 is a phase-shifted version of the output signal of the second magnetic sensor 102, to compare the output signals for determining the absolute phase of the signal being associated with the periodic changing magnetic field being generated by the mechanical component, and to determine information being indicative of characteristics of the mechanical component based on the determined absolute phase of the signal being associated with the periodic changing magnetic field being generated by the mechanical component.

From the knowledge of the mechanical dimensions of the setup (size of mechanical part, position of the sensors), it is possible to determine the spatial period of the sensing magnetic field. Since the two sensors are spaced, their outputs will not be the same but they will be phase-shifted copy of the same signal, apart from different offsets. Since also the distance between the sensors 1 is known, also the phase-shift between the two signals can be known. By comparing the two signals, their absolute phase, their offset and any zero-crossing can be detected, without knowing the amplitude of the signals or their frequency.

Figure 2:
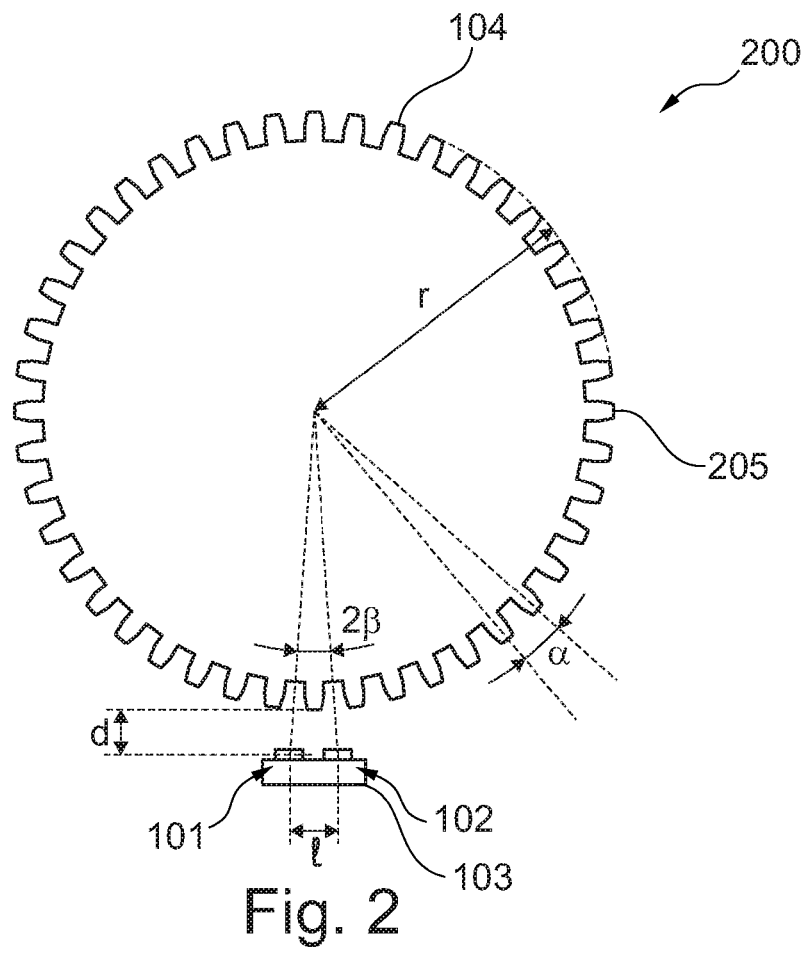
FIG. 2 illustrates a magnetic sensor arrangement according to a further exemplary embodiment of the invention.

As an example, FIG. 2 shows the setup for a magnetic sensor 200 measuring the rotation of a wheel 104. The wheel can be either a gear wheel made of magnetic material, so that the tooth-gap 205 structure perturbs a bias magnetic field, or a magnetized wheel in which the tooth-gap pairs are replaced by magnetic North-South dipoles. The sensors 101, 102 outputs will be:

$$\begin{cases} V_A = A\sin(\omega t + \theta_0 + \varphi) + V_{OS,A} \\ V_B = A\sin(\omega t + \theta_0 - \varphi) + V_{OS,B} \end{cases} \quad (1)$$

where $\omega$, A, and $\theta_0$, $V_{OS,A}$ and $V_{OS,B}$ are unknown angular frequency, amplitude, initial phase and offsets. The phase-shift between the two signals is $2\phi$ and dependent only on l, r, d and $\alpha$ (as shown in FIG. 2). l is the distance between the sensors, r is the radius of the wheel, d is the distance from the sensors to the wheel and $\alpha$ is the angle between two teeth. By computing the ratio of the derivatives of the two outputs, one gets:

$$y = \frac{\frac{\partial V_A}{\partial t}}{\frac{\partial V_B}{\partial t}} = \frac{\cos(\omega t + \theta_0 + \varphi)}{\cos(\omega t + \theta_0 - \varphi)} [-] \quad (2)$$

and the absolute phase $\theta = \omega t + \theta_0$ can be computed by inverting the function $$f(\theta) = \frac{\cos(\theta + \varphi)}{\cos(\theta - \varphi)}; \quad (3)$$

$$\theta = f^{-1}\left(\frac{\frac{\partial V_A}{\partial t}}{\frac{\partial V_B}{\partial t}}\right) [rad]$$

Thus, by measuring the derivates of the two outputs and using the above expression, $\theta$ can be instantaneously determined. Consequently, also zero-crossings of sensor 101 (when $\theta = -\phi$ or $\theta = \pi - \phi$) or zero-crossings of sensor 102 (when $\theta = \phi$ or $\theta = \pi + \phi$) or zero-crossing of any other sensor of which position is known (for a sensor equally spaced from sensor 101 and 102 when $\theta = 0$ or $\theta = \pi$) can be instantaneously detected.

Moreover, knowing $\theta$, it is also possible to determine not only the zero-crossings, but also the absolute position of the mechanical parts.

For the setup in FIG. 2, the angle $\beta$ under which the center of the wheel sees the two sensors can be computed as $$\beta = \tan^{-1}\left[\frac{l}{2(r+d)}\right] [rad] \quad (4)$$

The phase-shift can be computed as $$\varphi = 2\pi\frac{\beta}{\alpha} = N\tan^{-1}\left[\frac{l}{2(r+d)}\right] [rad] \quad (5)$$

where $\alpha$ is the angular period of the tooth-gap pairs and N is the total number of tooth-gap pairs on the wheel.

FIG. 3 shows the sensitivity of the phase-shift to variation of the mechanical dimension for a typical case for a 44-tooth-gap-pair wheel with radius of 3 cm. In particular, FIG. 3 shows the sensor phase shift versus the distance from the wheel as a function of the physical dimension and position of the sensor (radius of the wheel r=3 cm, number of tooth-gap pairs N=44, l between 0.1 mm and 1 mm, d between 0 mm and 3 mm) for different lengths between the sensors l. As can be seen by the different graphs 301, 302, 303, 304, 305, 306, 307, 308, 309, 310, illustrating different spacing l between 0.1 mm and 1 mm, the phase-shift is strongly dependent on the sensor spacing but this can be fixed very accurately during sensor manufacturing. For example, in case of integrated sensors, such as AMR or Hall sensors, the accuracy of the lithography is high enough to make its effect negligible.

FIG. 4 shows the maximum phase variation versus distance between the sensors 401 and FIG. 5 shows the average phase variation versus distance between sensors 501.

Note that with a sensor spacing of only 0.8 mm a phase shift of more than 30° is obtained, resulting in a relatively large phase-shift for a small total sensor dimension. Moreover, it can be observed that even with a variation of the distance d from the wheel ranging from 0 to 3 mm, the phase shift varies less than 4°. The effect of such an error on the determination of the zero-crossings is described below.

Note that while this particular example is representative of many practical applications, the concept can be applied also to different geometries. For example, it can be applied to detect the position of a mechanical part or component moving on a line parallel to the sensor and being furnished with a sequence of aligned tooth-gap pairs.

It can be concluded that large phase shift can be obtained with sensor smaller than 1 mm and that the error due to variation of the sensor positioning are in the order of 1%.

As briefly mentioned above, the function $$f(\theta) = \frac{\cos(\theta + \varphi)}{\cos(\theta - \varphi)}$$

is not invertible for the full interval of values $0 < \theta < 360°$. To solve this issue, the interval $0 < \theta < 360°$ may be divided in sub-intervals on which the function $f(\theta)$ is invertible. After determining to which of those sub-intervals $\theta$ belongs, the appropriate inverse function may be applied.

Under the assumptions of sinusoidal signals and that $\phi$ is smaller than 90°, the absolute phase $\theta$ can be determined in the following way. First, the quadrant in which $\theta$ lies is identified by using the following properties:
if $$\left|\frac{\partial V_B}{\partial t}\right| > \left|\frac{\partial V_A}{\partial t}\right|,$$

$\theta$ is in the first quadrant (i.e. $0 < \theta < 90°$) or in the third quadrant;
if $$\frac{\partial V_B}{\partial t} > 0,$$

θ is not in the third quadrant;
if $$\frac{\partial V_A}{\partial t} > 0,$$

θ is not in the second quadrant.
Those conditions are summarized in the following:
First quadrant (0<θ<90°):

$$\left|\frac{\partial V_B}{\partial t}\right| > \left|\frac{\partial V_A}{\partial t}\right|, \frac{\partial V_B}{\partial t} > 0$$

Second quadrant (90°<θ<180°):

$$\left|\frac{\partial V_B}{\partial t}\right| < \left|\frac{\partial V_A}{\partial t}\right|, \frac{\partial V_A}{\partial t} < 0$$

Third quadrant (180°<θ<270°):

$$\left|\frac{\partial V_B}{\partial t}\right| > \left|\frac{\partial V_A}{\partial t}\right|, \frac{\partial V_B}{\partial t} < 0$$

Fourth quadrant (270°<θ<360°):

$$\left|\frac{\partial V_B}{\partial t}\right| < \left|\frac{\partial V_A}{\partial t}\right|, \frac{\partial V_A}{\partial t} > 0$$

Thus, using only simple comparisons, the position of θ is identified.

The function $f(\theta)$ is inverted in the appropriate quadrant. For example, in the first quadrant, it results:

$$\theta = \cos^{-1}\left[\frac{\sin\varphi}{\sqrt{1 - \frac{2y}{(1+y)^2}(1+\cos 2\varphi)}}\right] \text{ [rad]} \quad (6)$$

where $$y = \frac{\partial V_A}{\partial t} \bigg/ \frac{\partial V_B}{\partial t}.$$

Note that while the previous calculations refer to sinusoidal outputs, a similar procedure can be applied to other waveforms. Moreover, the calculation or the eventual approximation must be ensured only around the values of θ for which the zero-crossings happens.

The derivative of each sensor output can be approximated using the system 600 shown in FIG. 6 for the sensor 101. At the start, the counter 605 is started. The counter 605 is stopped when the sensor 601 output goes out of the interval of width $2V_{th}$ centered on the sampled value of the sensor output at the start. The output of the counter at that moment will be $$N_A \cong \frac{f_{clk} V_{th}}{\left|\frac{\partial V_A}{\partial t}\right|} \quad [-] \quad (7)$$

where $f_{clk}$ is the clock signal frequency. The sign of $N_A$ is set to positive if the comparator 602 with the higher threshold switches first; negative, otherwise. Both comparator outputs are coupled to a logic gate 604. Using an appropriately small threshold $V_{th}$ and an appropriately high clock frequency, the ratio of the two derivatives y can be approximated as $$y = \frac{\frac{\partial V_A}{\partial t}}{\frac{\partial V_B}{\partial t}} \cong \frac{N_B}{N_A} \quad [-] \quad (8)$$

In order to reduce numerical errors, an additional measure can be taken. To limit the range over which y is computed, the ratio of the derivatives can be computed using the largest among $N_A$ and $N_B$ at the denominator and appropriately changing function $f(\theta)$. This avoids division by small numbers when one of the two derivatives approaches 0. This may mean defining y as $y=\min(N_A, N_B)/\max(N_A, N_B)$.

Figure 7:
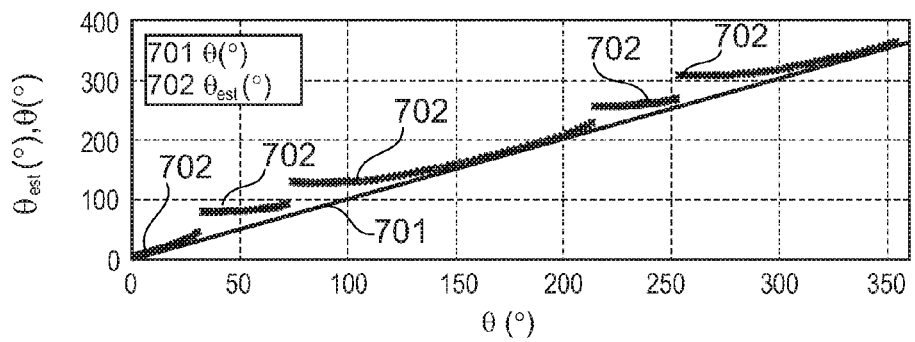
FIG. 7 illustrates a diagram showing an estimated absolute phase.
Figure 8:
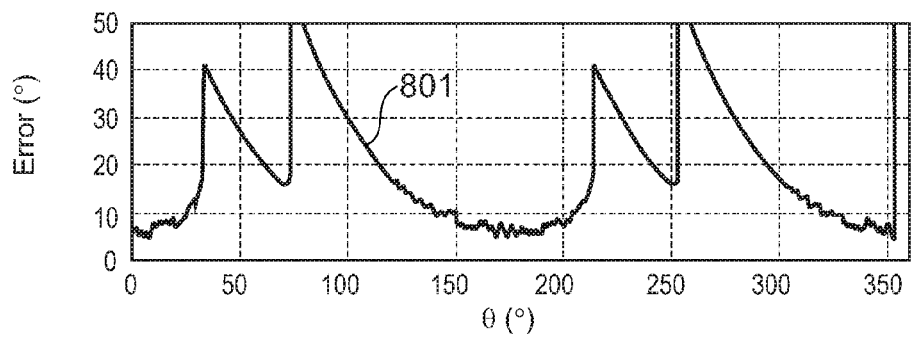
FIG. 8 illustrates a diagram showing an error in the estimation of the absolute phase of FIG. 7.

FIGS. 7 and 8 show the results of a simulation, where the absolute phase has been estimated using the previously described algorithm to approximate the derivative and the previously reported equations to compute θ. In particular, FIG. 7 shows the effective absolute phase θ 701 and absolute phase estimated by the algorithm $\theta_{est}$ 702 and FIG. 8 shows the difference between estimated and effective absolute phase 801. The simulation is based on the values: $\phi=20°$, $V_{th}=20\%$ A, $f_{clk}=20$ MHz, signal frequency 20 kHz.

Note the presence of larger errors and discontinuities in the estimated absolute phase are due to larger error in the approximation of the derivatives for some values of θ. This may happen when the derivative approximation algorithm tries to estimate the derivative of the sinusoidal waveform around its maximum and minimum. However, in practical cases, those regions are far from the region of interest, i.e. far from the zero-crossings, thus not representing an issue.

If more accuracy is needed, lower values for $V_{th}$ and higher clock frequency $f_{clk}$ must be used. That would reduce both the maximum errors, i.e. the error at the discontinuities, and the error in the regions of the zero crossing. For example, by decreasing the threshold by a factor 10 and increasing the clock frequency by the same factor with respect of the simulation shown in FIGS. 6 and 7, the maximum errors may drop to less than 15° and the error for θ in the 160°-200° range may be lower than 3°. However, this might require a faster front-end with a higher sensitivity.

Since the computation of the absolute phase θ requires the division between two numbers ($N_A$, $N_B$) and the evaluation of the complex function (6), it can result in a complex hardware implementation. To simplify the computation, the functions could be approximated or linearized near the point of interest, i.e. the zero-crossings of $V_A$ and $V_B$. It can be proven that one just need to approximate the function $f^{-1}(y)$ around the value $\theta=\phi$.

By simple linearization one get $$\theta \cong \varphi + \cot 2\varphi - \frac{1}{\sin 2\varphi} y = \varphi + \cot 2\varphi - \frac{1}{\sin 2\varphi} \frac{N_B}{N_A} \quad [rad] \quad (9)$$

Figure 9:
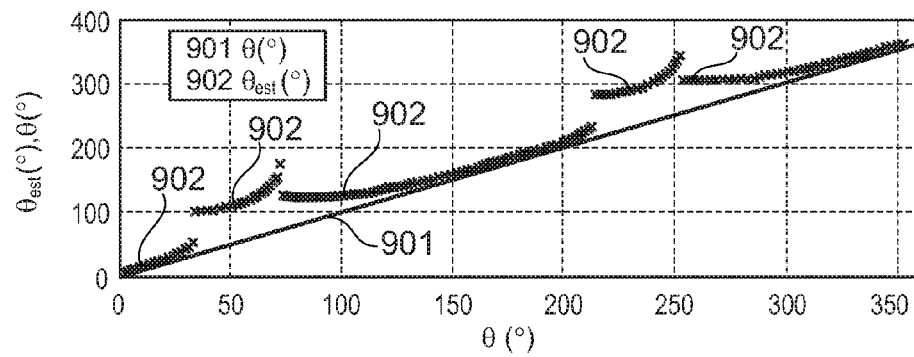
FIG. 9 illustrates a diagram showing an estimated absolute phase for another approximation.
Figure 10:
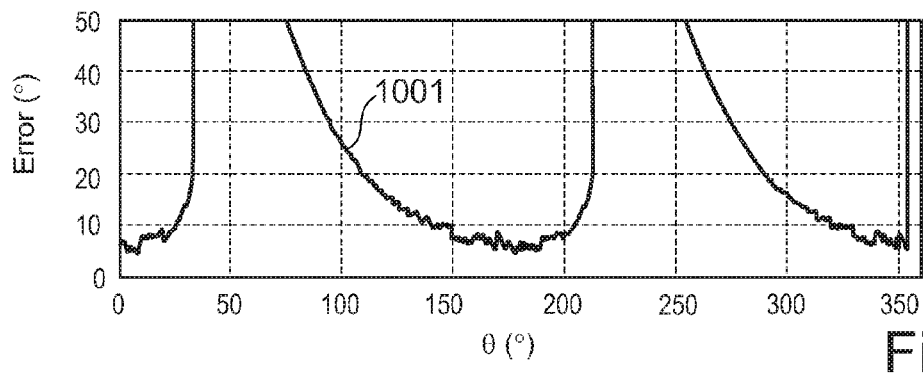
FIG. 10 illustrates a diagram showing an error in the estimation of the absolute phase of FIG. 9.

The resulting error using this approximation is shown in FIGS. 9 and 10. FIGS. 9 and 10 show a simulation of absolute phase estimation using approximated derivative calculation and linearized function for θ, i.e., Equation (9), ($\phi$=20°, $V_{th}$=20% A, fclk=20 MHz, signal frequency 20 kHz). FIG. 9 shows the effective absolute phase $\theta$ 901 and absolute phase estimated by the algorithm $\theta_{est}$ 902. FIG. 10 shows the difference between estimated and effective absolute phase 1001.

However, a division is still needed. A further simplification can be done if one observes that for the absolute phases for which zero crossing happen, the following equation holds:

$$\frac{N_B}{N_A} \cong y = \frac{\cos(\theta + \varphi)}{\cos(\theta - \varphi)} = \cos(2\varphi) \quad [-] \quad (10)$$

Detection of a zero-crossing is then equivalent to detection a zero of the function:

$$H(N_A, N_B) \cong N_A \cos 2\phi - N_B [\text{rad}] \quad (11)$$

This can be further simplified in the special case $\phi$=30°, for which the function becomes $$H(N_A, N_B) \cong \frac{N_A}{2} - N_B \quad [\text{rad}] \quad (12)$$

This case could be convenient for a practical realization, because the above expression can be implemented in a digital circuit with binary logic with only additions, subtractions and bit-shifts.

Figure 11:
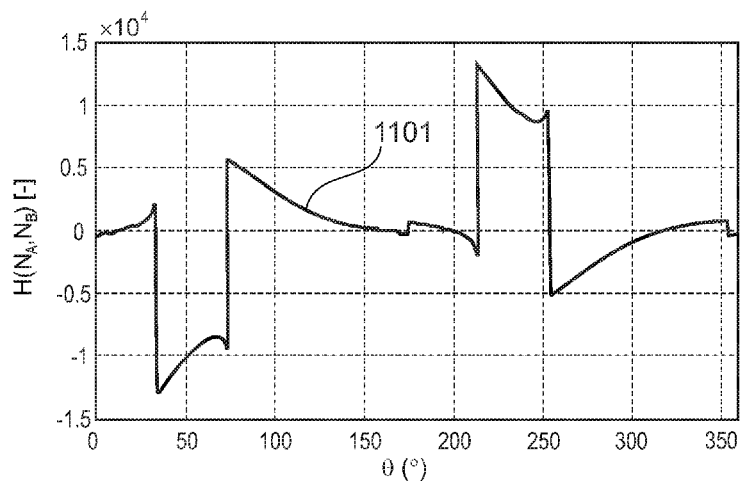
FIG. 11 illustrates a diagram showing a simulation of absolute phase estimation with approximated derivative calculation.

FIG. 11 shows the results of a simulation where the previous expression is adopted. It is shown the simulation of absolute phase estimation 1101 with approximated derivative calculation and simplified function $H(N_A, N_B)$ from Equation (11) for $\phi$=20°, $V_{th}$=20% A, $f_{clk}$=20 MHz, signal frequency 20 kHz. The function has zeros in correspondence of the zero crossings of signals $V_A$ and V. Note that in the ideal case, i.e. when Eq. (7) holds exactly and not as an approximation, zeros are obtained for the 4 values: $\theta$=$\phi$, $\theta$=180°–$\phi$, $\theta$=180°+$\phi$, $\theta$=360°–$\phi$. Those cases can be discriminated by looking at the value and sign of the derivative, as explained above. With the same parameters used for the previously shown simulations, the zeros of the function are not located in the location of the ideal zeros but in their neighborhood, resulting in an error in the zero-crossing detection. The error in zero-crossings are approximately 7°, 1°, 2° and 21° for the angles $\theta$=$\phi$, $\theta$=180°–$\phi$, $\theta$=180°+$\phi$, $\theta$=360°–$\phi$, respectively. More accuracy can be obtained by getting a better derivative approximation, i.e. by decreasing $V_{th}$ and increasing $f_{clk}$.

Additional errors in the detection of the zero-crossings are due to errors in the estimation of $\phi$, i.e. the phase shift between the two sensors. Those errors can be due to fabrication errors, such as variations in the distance between the two sensors 1 or variations in the pole-gap distance of the wheel or to variations of the mechanical setup, such as variation in the distance between the sensors and the magnetized mechanical components. A first estimate of the effect of such errors can be done using the following approximation $$\Delta\theta \cong \frac{\frac{\partial f}{\partial \varphi}}{\frac{\partial f}{\partial \theta}} \Delta\varphi = \frac{\sin 2\theta}{\sin 2\varphi} \Delta\varphi \quad (13)$$

where it is used that $$f(\theta) = \frac{\cos(\theta + \varphi)}{\cos(\theta - \varphi)}.$$

As already stated above, the errors in the zero crossings can be analyzed in the region next to the point $\theta$=$\phi$. In that region, an error in the phase shift of less than 4° may translate in an error in the zero-crossing detection of less than 4°, i.e. of less than approximately 1% of the signal period.

Figure 12:
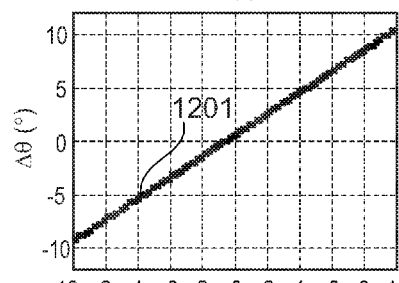
FIG. 12 illustrates a diagram showing an error in the estimation of absolute phase.

FIG. 12 shows the simulated error 1201 of the estimated phase for $\theta$=180°. In this case, parameters other than phase shift have been chosen to minimize their contribution to the total error. Simulations are in good agreement with Equation (13). The simulated error in the estimation of the absolute phase for $\theta$=180° is shown versus errors in the phase shift between the two sensors ($\phi$=20°, $V_{th}$=2% A, $f_{clk}$=2 GHz, signal frequency 20 kHz).

Figure 13:
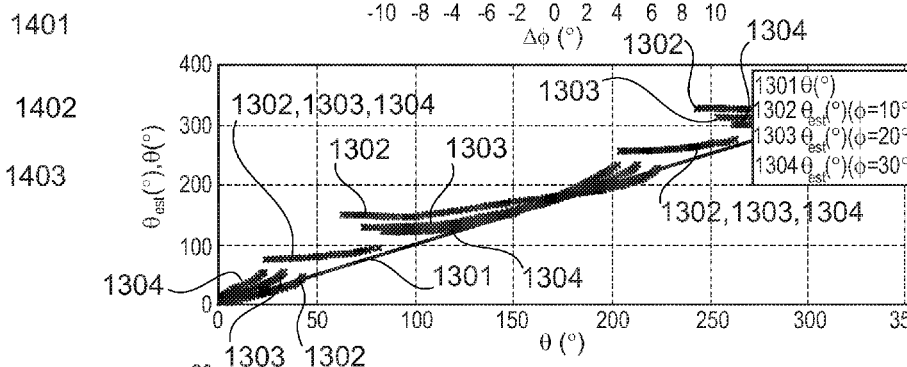
FIG. 13 illustrates a diagram showing estimated absolute phase.
Figure 14:
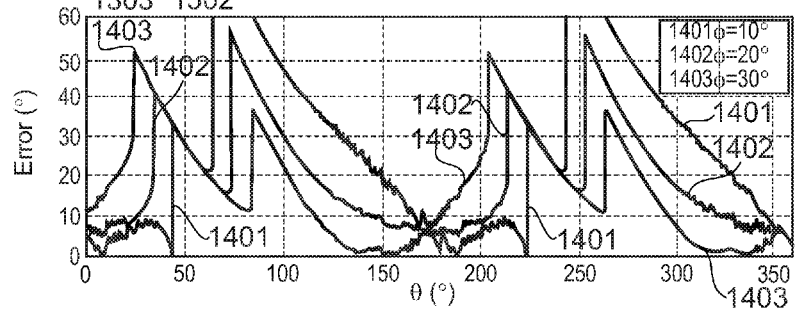
FIG. 14 illustrates a diagram showing an error in the estimation of the absolute phase of FIG. 13.

To further clarify the effect of an error in the estimation of $\phi$, simulation of the full algorithm for three different values of $\phi$ (10°, 20°, 30°) is shown in FIGS. 13 and 14. Note that in those simulations the phase-shift is varied (which is equivalent to using a wheel with different spacing) but the algorithm is always assuming a phase shift equal to 20°. Note that this phase-shift variation would correspond to a variation of the number of tooth-gap pairs in the range from 24 to 66 (if 44 is assumed as the nominal number of tooth-gap pairs). The simulation of absolute phase estimation with approximated derivative calculation is shown in FIG. 13 for the values $V_{th}$=20% A, $f_{clk}$=20 MHz, signal frequency 20 kHz for several values of $\phi$; the figure shows the effective absolute phase $\theta$ of 0° (1301), and the absolute phase estimated by the algorithm when the phase shift assumed in the algorithm is $\phi$=10° (1302), $\phi$=20° (1303), $\phi$=30° (1304), respectively. While the values of $\phi$ varies (with consequence on the phase shift of the two sensors), the algorithm is run assuming (erroneously) that the phase-shift is 20°. FIG. 14 shows the difference between estimated and effective absolute phase for a phase shift $\phi$ of 10° (1401), 20° (1402) and 30° (1403).

The proposed system and method can be used for very low frequency signals. If the method to approximate the derivatives is used, there might be latency between the occurrence of a zero-crossing and its detection. The latency is equal to the time needed for the sensor output signal to cross the threshold of the comparators 602, 603 in FIG. 6. This delay is dependent on the amplitude and frequency of the signal and to the value of the threshold $V_{th}$. In particular, the latency is proportional to the signal period, resulting in a constant latency in terms of fractions of periods, for a fixed amplitude and threshold. This is allowed in many applications, where only the accuracy of the duty-cycle of the signal resulting from the zero-crossing detection is significant, and the accuracy of the zero-crossing detection is expressed as a percentage of the signal period and not in absolute terms. However, for very slow signals, the output of the counter 605 in FIG. 6 can become very large, limiting the practical implementation of the system.

If a fixed clock frequency is used, the counter 605 in FIG. 6 might be needed to be sized to store the number of cycles corresponding to the lowest expected signal frequency. For a clock frequency of 20 MHz and a 50-bit counter, the lowest allowed frequency would be approximately $10^{-8}$ Hz, corresponding to a period of more than one year. For the processing of $N_A$ and $N_B$ to find the absolute phase, such high accuracy is not needed and it is sufficient to scale $N_A$ and $N_B$ by the same amount (for example by bit-shifts) to shorten their binary representation and simplify the implementation of the hardware.

Figure 15:
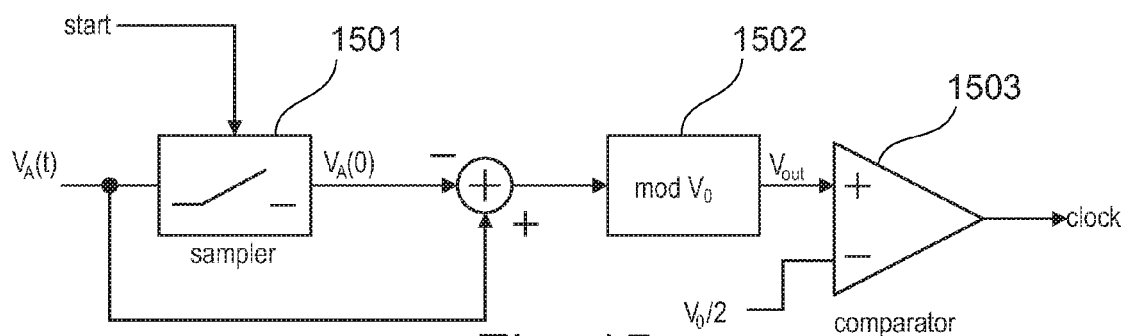
FIG. 15 illustrates a block diagram illustrating obtaining a clock with a frequency approximately proportional to the signal frequency.
Figure 16:
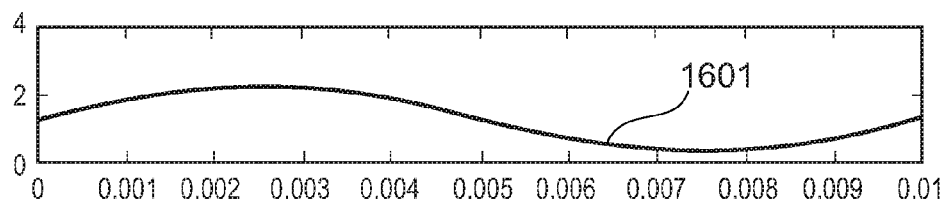
FIG. 16 illustrates a diagram showing the sensor output of FIG. 15.
Figure 17:
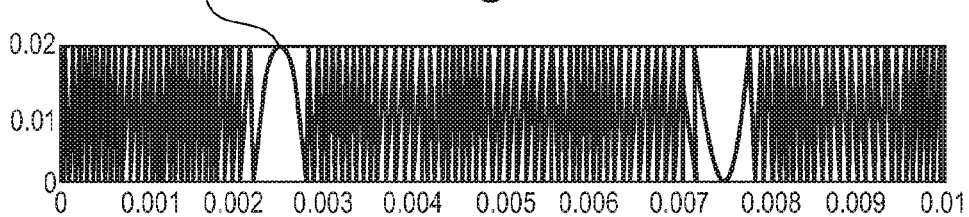
FIG. 17 illustrates a diagram showing output Vout of FIG. 15.
Figure 18:
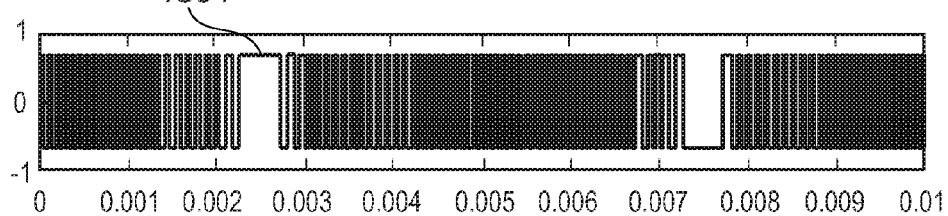
FIG. 18 illustrates a diagram showing the clock of FIG. 15
Figure 19:
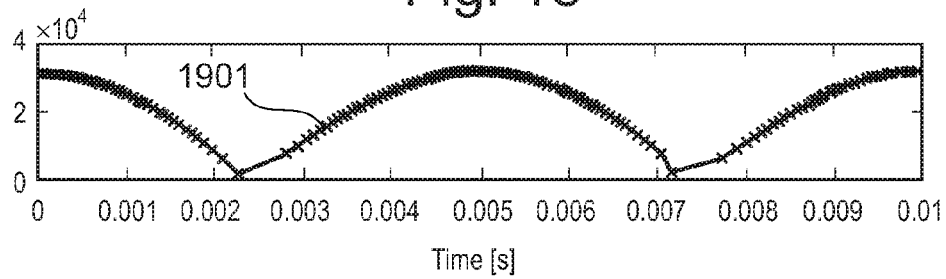
FIG. 19 illustrates a diagram showing the instantaneous clock frequency of FIG. 15.

To solve this, in one embodiment, a clock frequency $f_{clk}$ proportional to the signal frequency can be used. A clock signal approximately proportional to the signal frequency can be generated using the system as shown in FIG. 15. The system part of FIG. 15 used to obtain a clock with a frequency approximately proportional to the signal frequency comprises a sampler 1501 receiving $V_A(t)$. A modulo $V_0$ unit 1502 processes the output of the sampler and provides it to a comparator 1503. The comparator outputs a clock. As confirmed by the simulation results (for signal frequency of 100 Hz, signal amplitude A=1 and $V_0$=0.02) in FIG. 16 (showing the sensor output), 17 (showing Vout), 18 (showing the clock) and 19 (showing the instantaneous frequency of the clock signal), the clock frequency varies between approximately $$\frac{2\pi A}{V_o}f \text{ and } \pi\sqrt{\frac{A}{V_o}}f,$$

where f is the frequency of the sensor output. By using such clock frequency in the system of FIG. 6, the output of the counter 605 may be approximately independent of the signal frequency. The counter could then be designed appropriately and its working is ensured for signal frequencies arbitrarily low.

In the previous description, the herein described system and method have been used to determine the zero-crossing of the magnetic field. However, in some applications, the described procedure may be too complex or too prone to errors and noise. In such cases, the herein described system and method can be used only for offset compensation.

In such setup, the complete system is composed by two sensors: a main sensor, characterized by high performance, such as high sensitivity and low noise, and an offset-compensated sensor, which is characterized by a low residual offset. The sensor arrangement as described herein would be used to implement the offset-compensated sensor. The purpose of the offset-compensated sensor is to approximately detect the zero-crossings and to use such instants to compensate for the offset of the main sensor.

The herein described sensor system or arrangement is composed by two magnetic sensors placed at a fixed distance, whose outputs signals can be processed to cancel the offset of each of the sensors at start-up without any offset calibration when the sensing field is periodic. By cancelling the offset of the sensor, the zero crossings of the magnetic field sensed by each of the sensors can be instantaneously and accurately detected. The absolute phase of the periodic changing magnetic field can be derived by computing the ratio of the derivative of the two sensor outputs and by determining the sign of such derivatives and the largest between the absolute values of the derivatives. The ratio of the derivative of the sensor outputs can be approximated by the ratio of the numbers of periods of a reference clock that each signal takes to exit the interval of fixed width centered on the signal value at start-up. When the frequency of the magnetic field is very low, the reference clock can be directly derived from the input signal in order to limit the maximum number of periods of the reference clock to be counted to compute the approximation of the derivative. The zero-crossings can be detected by an approximated expression involving only scale factors, summations and subtractions. In the particular case when the phase shift between the two sensors is 30°, the zero-crossings can be detected by using an approximated expression involving only simple binary operation, i.e. summations, subtractions and bit shifts. The offset-free sensor system can be used to find the instants when the magnetic field is zero and use such instants to trim the offset of an additional high-accuracy magnetic sensor.

The herein described system and method can be used in magnetic sensors. It is particularly suited for automotive applications and for speed sensors, like the ones used for ABS, transmission, crankshaft and camshaft applications.

Moreover, the algorithm described can be used in any sensor system in which at least two sensors are used to sense the same physical quantity and there is a phase shift between the physical quantities at the input of the sensors. By knowing the value of this phase shift, the algorithm can be used to cancel the effect of two sensors. A particular application would be the application to angular sensors, such as magnetic angular sensors. Angular sensors are usually composed of two sensors which sense the cosine and sine of the angle to be sensed. For example, in magnetic angular sensors, it is needed to sense the angle α between a rotating magnetic field and a fixed direction. A first magnetic sensor is placed to sense the component of the field along the fixed direction; a second magnetic sensor is placed to sense the component orthogonal to the fixed direction. In such an arrangement, the first sensor input will be equal to H cos(α) and the second sensor input will be H sin(α), where H is the amplitude of the magnetic field. Thus, the two sensor inputs are phase shifted by φ=90°, and the previously described algorithm can be applied.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A magnetic sensor arrangement for determining information indicative of characteristics of a mechanical component, the magnetic sensor arrangement comprising:
    a first magnetic sensor, including circuitry configured to sense a signal associated with a periodic changing magnetic field generated due to a relative movement of the mechanical component in relation to the magnetic sensor arrangement and in response, to generate an output signal,
    a second magnetic sensor, including circuitry configured to sense the signal associated with the periodic changing magnetic field and in response, to generate an output signal, wherein the first magnetic sensor is arranged at a fixed distance to the second magnetic sensor, and
    a determination unit, including circuitry coupled to the first magnetic sensor and the second magnetic sensor and being configured
        to receive the output signal of the first magnetic sensor and the output signal of the second magnetic sensor, wherein the output signal of the first magnetic sensor is phase-shifted to the output signal of the second magnetic sensor,
        to compare the output signals for determining the absolute phase of the signal associated with the periodic changing magnetic field by ascertaining that the absolute phase corresponds to a range covering full interval of absolute phase values, wherein the absolute phase is calculated using an approximate absolute phase near zero-crossings of the output signals of the first and the second magnetic sensors, and to determine information indicative of characteristics of the mechanical component based on the determined absolute phase of the signal associated with the periodic changing magnetic field.

2. The magnetic sensor arrangement according to claim 1, wherein the comparison of the output signals for determining the absolute phase of the signal associated with the periodic changing magnetic field generated by the mechanical component is based on a ratio of derivatives of each of the output signals.

3. The magnetic sensor arrangement according to claim 1, wherein the periodic changing magnetic field is a rotating magnetic field due to relative movement of the mechanical component, wherein the magnetic sensor arrangement is an angle sensor for sensing an angle between the rotating magnetic field and a fixed direction, wherein the first magnetic sensor is configured to sense a signal of the rotating magnetic field along the fixed direction and the second magnetic sensor is configured to sense a signal of the rotating magnetic field orthogonal to the fixed direction, and wherein the information indicative of characteristics of the mechanical component corresponds to the angle between the rotating magnetic field and the fixed direction.

4. The magnetic sensor arrangement according to claim 1, wherein the determination unit is further configured to determine characteristics of the output signal of the first magnetic sensor and of the output signal of the second magnetic sensor based on the comparison of the output signals wherein the characteristics of the output signals comprise one of an offset between the output signals, an absolute phase of the output signals and zero-crossings of the output signals.

5. The magnetic sensor arrangement according to claim 1, wherein the determined information indicative of characteristics of the mechanical component comprises the position of the mechanical component.

6. The magnetic sensor arrangement according to claim 1, wherein the mechanical component is one of a rotating moving mechanical component, and a linear moving mechanical component providing a periodic changing magnetic field.

7. The magnetic sensor arrangement according to claim 1, further comprising a third magnetic sensor including circuitry and configured to sense a signal associated with the periodic changing magnetic field, wherein the third magnetic sensor is arranged at a fixed distance to at least one of the first magnetic sensor and the second magnetic sensor and wherein the determination unit is further coupled to the third magnetic sensor and is further configured to receive the output signal of the third magnetic sensor, wherein the output signal of the third magnetic sensor is phase-shifted to at least one of the output signal of the first magnetic sensor and the second magnetic sensor, to compare the output signals for determining the absolute phase of the signal associated with the periodic changing magnetic field and to determine information indicative of characteristics of the mechanical component based on the determined absolute phase of the signal associated with the periodic changing magnetic field.

8. A sensor system comprising a magnet sensor arrangement according to claim 1 and a mechanical component configured and arranged to move relative to the to the magnetic sensor arrangement and to interact with the magnetic field.

9. A method of determining information indicative of characteristics of a mechanical component, the method comprising sensing, by a first magnetic sensor that includes circuitry, a signal associated with a periodic changing magnetic field generated due to a relative movement of the mechanical component in relation to the first magnetic sensor, sensing, by a second magnetic sensor that includes circuitry, the signal associated with the periodic changing magnetic field, wherein the first magnetic sensor is arranged at a fixed distance to the second magnetic sensor, and receiving, by a determination circuit coupled to the first magnetic sensor and the second magnetic sensor, an output signal of the first magnetic sensor and the output signal of the second magnetic sensor, wherein the output signal of the first magnetic sensor is phase-shifted to the output signal of the second magnetic sensor, comparing the output signals for determining the absolute phase of the signal associated with the periodic changing magnetic field by ascertaining that the absolute phase belongs in one of a plurality of sub-interval ranges which collectively correspond to a full interval of absolute phase values, wherein the absolute phase is calculated using an approximate absolute phase near zero-crossings of the output signals of the first and the second magnetic sensors, and determining information indicative of characteristics of the mechanical component based on the determined absolute phase of the signal associated with the periodic changing magnetic field.

10. A non-transitory computer-readable medium comprising a computer program that determines information indicative of characteristics of a mechanical component, which said computer program, when executed by a processor, one of carries out and controls a method according to claim 9.

11. A magnetic sensor arrangement for determining information indicative of characteristics of a mechanical component, the magnetic sensor arrangement comprising:

a first magnetic sensor, including circuitry configured to sense a signal associated with a periodic changing magnetic field generated due to a relative movement of the mechanical component in relation to the magnetic sensor arrangement and in response, to generate an output signal, a second magnetic sensor, including circuitry configured to sense the signal associated with the periodic changing magnetic field and in response, to generate an output signal, wherein the first magnetic sensor is arranged at a fixed distance to the second magnetic sensor, and a determination unit, including circuitry coupled to the first magnetic sensor and the second magnetic sensor and being configured
- to receive the output signal of the first magnetic sensor and the output signal of the second magnetic sensor, wherein the output signal of the first magnetic sensor is phase-shifted to the output signal of the second magnetic sensor,
- to compare the output signals for determining the absolute phase of the signal associated with the periodic changing magnetic field, by calculating a first derivative of a first output signal from the first magnetic sensor, by calculating a second derivative of a second output signal from the second magnetic sensor, the second output signal being phase-shifted relative to the first output signal, and determining the absolute phase of the signal associated with the periodic changing magnetic field based on the first derivative and the second derivative, and
- to determine information indicative of characteristics of the mechanical component based on the determined absolute phase of the signal associated with the periodic changing magnetic field.

12. The magnetic sensor arrangement according to claim 11, wherein the determination unit is a circuit is configured to determine the absolute phase independent of amplitude of the first and second output signals.

13. The magnetic sensor arrangement according to claim 11, wherein the determination unit is a circuit configured to determine the absolute phase independent of respective offset of one or both of the first and second output signals.

14. The magnetic sensor arrangement according to claim 11, wherein the determination unit is a circuit configured to determine the absolute phase based on a ratio of the first derivative and the second derivative.

15. A method of determining information indicative of characteristics of a mechanical component,
the method comprising
- sensing, by a first magnetic sensor that includes circuitry, a signal associated with a periodic changing magnetic field generated due to a relative movement of the mechanical component in relation to the first magnetic sensor,
- sensing, by a second magnetic sensor that includes circuitry, the signal associated with the periodic changing magnetic field, wherein the first magnetic sensor is arranged at a fixed distance to the second magnetic sensor,
- receiving, by a determination circuit coupled to the first magnetic sensor and the second magnetic sensor, an output signal of the first magnetic sensor and the output signal of the second magnetic sensor, wherein the output signal of the first magnetic sensor is phase-shifted to the output signal of the second magnetic sensor,
- comparing the output signals for determining the absolute phase of the signal associated with the periodic changing magnetic field,
- determining information indicative of characteristics of the mechanical component based on the determined absolute phase of the signal associated with the periodic changing magnetic field,
- calculating a first derivative of a first output signal from the first magnetic sensor,
- calculating a second derivative of a second output signal from the second magnetic sensor, the second output signal being phase-shifted relative to the first output signal, and
- determining the absolute phase of the signal associated with the periodic changing magnetic field based on the first derivative and the second derivative.

16. The method of claim 15, wherein determining the absolute phase includes determining the absolute phase independently of amplitude of the first and second output signals.

17. The method of claim 15, wherein determining the absolute phase includes determining the absolute phase independently of respective offset of one or both of the first and second output signals.

18. The method of claim 15, wherein determining the absolute phase includes determining the absolute phase based on a ratio of the first derivative and the second derivative.

* * * * *